United States Patent
Petricek

(10) Patent No.: US 11,937,404 B2
(45) Date of Patent: Mar. 19, 2024

(54) PRESSING DEVICE

(71) Applicant: Siemens Aktiengesellschaft, Munich (DE)

(72) Inventor: Martin Petricek, Hollabrunn (AT)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 542 days.

(21) Appl. No.: 17/279,704

(22) PCT Filed: Sep. 12, 2019

(86) PCT No.: PCT/EP2019/074364
§ 371 (c)(1),
(2) Date: Mar. 25, 2021

(87) PCT Pub. No.: WO2020/064355
PCT Pub. Date: Apr. 2, 2020

(65) Prior Publication Data
US 2021/0400839 A1    Dec. 23, 2021

(30) Foreign Application Priority Data
Sep. 26, 2018 (EP) .................... 18196828

(51) Int. Cl.
*H05K 7/20* (2006.01)
(52) U.S. Cl.
CPC .................. *H05K 7/2049* (2013.01)
(58) Field of Classification Search
CPC ........... H05K 7/2039; H05K 7/20454; H05K 7/2049; H05K 7/20509;
(Continued)

(56) References Cited

U.S. PATENT DOCUMENTS 4,922,601 A * 5/1990 Mikolajczak ....... H01L 23/4093
361/710
6,347,038 B1 * 2/2002 Duarte ................ H05K 3/0061
361/705
(Continued)

FOREIGN PATENT DOCUMENTS

| CN | 103075566 | 5/2013 |
|---|---|---|
| CN | 103890486 | 6/2014 |

(Continued)

OTHER PUBLICATIONS

EP3208843 English Translation (Year: 2017).*
PCT International Search Report dated Dec. 2, 2019 based on PCT/EP2019/074364 filed Sep. 12, 2019.

*Primary Examiner* — Amir A Jalali
(74) *Attorney, Agent, or Firm* — Cozen O'Connor

(57) ABSTRACT

A device via which components mounted on a carrier plate can be pressed against a heat sink that is arranged on a side or underside of a carrier plate that is not equipped with components at least in a cooling region, the device through which at least one component can be pressed on includes at least one hollow body for receiving at least one fastening body and at least one spring arm formed in an Omega shape and has, at the end thereof, a bearing face formed as a polygonal flattening for transmitting a pressing force onto the component to be cooled, where the device is further formed in one part as a plastics injection-molded part and can be installed easily and quickly (particularly automated manner) and enables a space-saving arrangement of components to be cooled, particularly whilst maintaining predefined electrical clearances and/or predefined air gaps and creepage distances.

9 Claims, 2 Drawing Sheets

(58) Field of Classification Search
CPC ........ H05K 7/2089–209; H05K 1/0203; H01L 23/40; H01L 23/4006; H01L 24/90
See application file for complete search history.

(56) References Cited

U.S. PATENT DOCUMENTS

| | | |
|---|---|---|
| 10,939,585 B2* | 3/2021 | Chida ..................... H05K 7/20 |
| 2009/0168360 A1* | 7/2009 | Negrut ................ H01L 23/4006 |
| | | 361/688 |
| 2012/0218712 A1* | 8/2012 | Hayashi ............... H05K 7/2049 |
| | | 403/327 |
| 2014/0247611 A1 | 9/2014 | Sachsenweger et al. |
| 2018/0162098 A1 | 6/2018 | Joo |

FOREIGN PATENT DOCUMENTS

| | | |
|---|---|---|
| EP | 3208843 | 8/2017 |
| EP | 3208843 A1 * | 8/2017 |

* cited by examiner

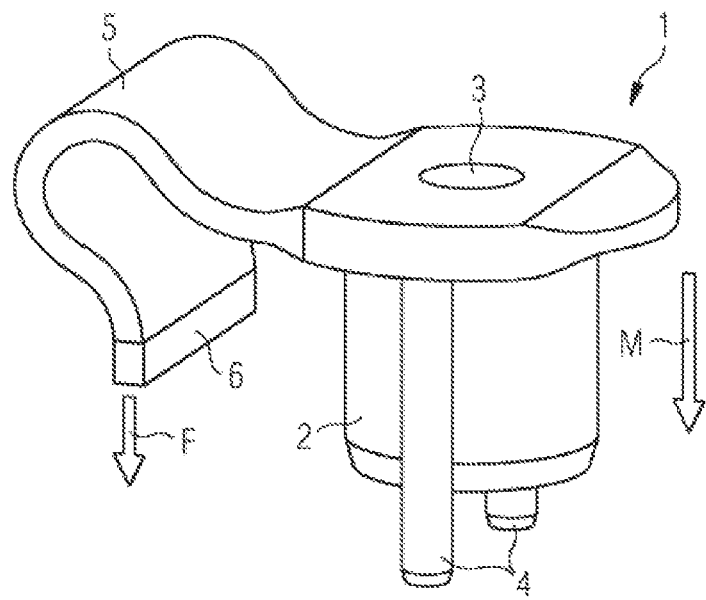
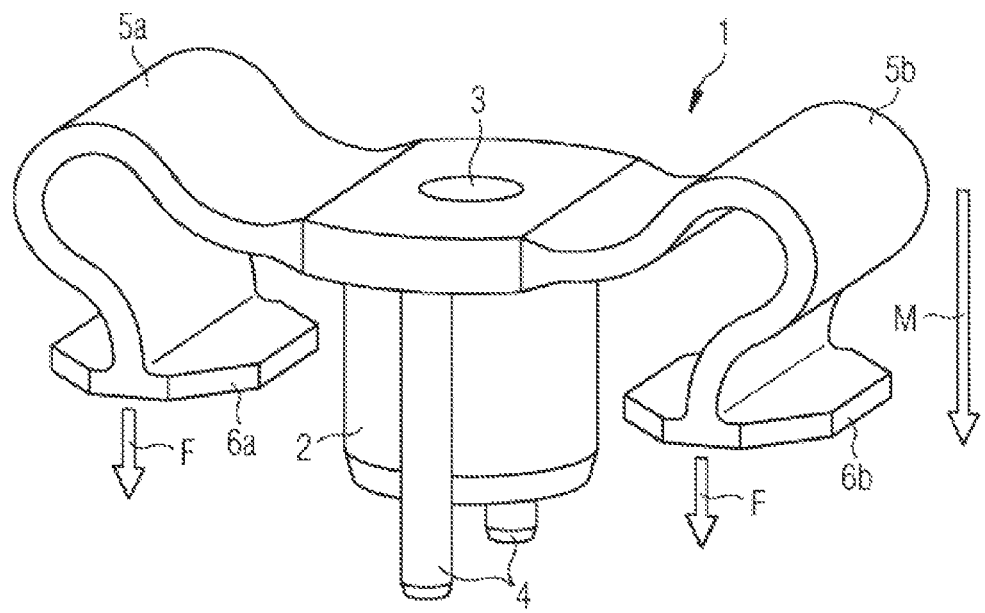

PRESSING DEVICE

CROSS-REFERENCE TO RELATED APPLICATIONS

This is a U.S. national stage of application No. PCT/EP2019/074364 filed 12 Sep. 2019. Priority is claimed on European Application No. 18196828.0 filed 26 Sep. 2018, the content of which is incorporated herein by reference in its entirety.

BACKGROUND OF THE INVENTION

1. Field of the Invention

The present invention generally relates to the field of electrical and electronic devices, particularly the field of switched-mode power supplies and power-electronic circuits and, more specifically, to a device by which components mounted on a carrier plate can be pressed against a heat sink, where the components are cooled via the carrier plate or via contact between the components and the carrier plate, and the heat sink is arranged on a side or underside of the carrier plate that is not equipped with components, at least in a thermal contact region or in a cooling region.

2. Description of the Related Art

Devices, in particular electrical or electronic devices, such switched-mode power supplies, power-electronic circuits, or control devices, are nowadays usually made up of electrical components and/or modules. The components in this case are accommodated on a carrier plate (i.e., a printed circuit board), which is used for mechanical fastening and also, via "conductor tracks", for electrical connection of the components. The components can be fastened by soldering them onto solder surfaces or in solder eyes, by gluing them on, and with larger components by screwing them onto the printed circuit board.

Frequently, the circuitry of a device, in particular an electrical device, comprises semiconductor components, such power semiconductor components, by which a mostly thermal loss energy, i.e., heat, is produced. In order, for example, to prevent damage to or overheating of the respective component or the circuit or a malfunction of the device caused by the power loss or heat, it is necessary to cool the components producing this power loss accordingly or to dissipate the heat produced.

To this end, the carrier plate or printed circuit board, upon which the semiconductor components producing the power loss or to be cooled are located, is usually connected to a part dissipating the heat, i.e., a heat sink. A "heat bridge", which usually consists of a metal that conducts heat well, mostly aluminum or copper, is formed by the heat sink, in order to conduct heat arising away from the component to be cooled and emit it to an area around the device, for example. Heat sinks are used, for example, in the power electronics, or in control devices, above all for cooling power semiconductors (e.g., power diodes, or power transistors).

With circuits mounted on carrier plates or printed circuit boards, the heat sink can be arranged, for example, on a side, which at least in a region of components producing power loss or components to be cooled, i.e., in a cooling area, is excluded from being equipped with components, or is arranged resting against an underside of the carrier plate. That is, the heat loss or power loss generated by a component is then conducted from the component through the carrier plate to the heat sink or the carrier plate is located between the heat sink and a component to be cooled. With carrier plates or printed circuit boards with through-connections in particular, i.e., a vertical electrical connection between conductor track levels of the printed circuit board in the form of holes metalized internally, the heat can also be dissipated from the component via the through-connections to the heat sink. With circuits on carrier plates or printed circuit boards with through-connections, for attaching and connecting the components an additional electrically insulating layer and/or insulation elements, e.g., made of ceramics, silicon rubber or a special plastic are frequently inserted during assembly for galvanic separation or for insulation between the carrier plate or the through-connection and the metallic heat sink.

In order to promote the dissipation of heat, heat sinks need a good thermal connection to the component to be cooled in each case. Therefore, it is necessary to establish a contact between the heat sink and the component to be cooled that is as close and as good as possible. To compensate for unevenness, e.g., between the underside of the carrier plate and a surface of the heat sink and to establish a better heat transition to the heat sink, a thin layer of heat-conducting paste can be applied before assembly. For an electrically insulating assembly, the inserted electrically insulating layer and/or the insulation elements can be used, for example, to compensate for unevenness and to improve the heat transmission.

In order to establish the corresponding close and good thermal contact between the component to be cooled and the heat sink, the component is usually also pressed against the heat sink. To this end, spring plates can be used, for example, which are arranged on the component to be cooled, for example, and fastened via screws or clamps. The spring plates then exert a pressure force, for example, which presses the components against the carrier plate and thus against the heat sink arranged on the underside of the carrier plate. The use of spring plates for pressing on components has the disadvantage, however, that assembly mostly has to be performed manually and is associated with relatively high outlay.

With electrical devices above all, such as switched-mode power supplies or with power-electronic circuits, predefined electrical clearances or minimum distances for air or creepage distances between conducting parts of the circuit are usually to be taken into account. This means that for safety and/or functional reasons, minimum distances are to be maintained between, for example, the conductor tracks, component contacts and further conducting parts such as heat sinks, fastener and also spring plates for pressing-on components, in order, for example, to protect people or devices as well as possible against the effects of electrical voltage and/or current. Such minimum distances are predefined, for example, in standards, such in the European standard EN 60 664-1, etc. This leads, with the use of spring plates for pressing-on of components, for achieving the necessary or predefined electrical clearances or air and creepage distances, for example, to relatively large distances being needed in the arrangement of the components on the carrier plate. As an alternative or in addition, the electrical clearances can also be insured by building in insulation films and/or insulation elements, e.g., between spring plate and component. This leads, on the one hand, to a higher space requirement for the circuit. On the other hand, this makes the assembly relatively time-consuming and complex, because particularly for the pressing-on of the components, as well as the spring plate, other additional elements for insulation are needed. A cost-effective and possibly automated carrying out of the assembly of the circuit or the spring plates is thus scarcely possible any longer.

EP 3 208 843 A1 discloses a retaining clip for assembly of small square components, such as semiconductor components, on a flat carrier surface. This retaining clip has at least one bent sprung plate for holding down the component, of which one end is can be connected to the carrier surface and of which the other end can be applied for sprung support of a small square component placed on the carrier surface. The retaining clip is manufactured from spring steel and, for use in an electrical device, must be coated or surround-molded with an electrically insulating plastic coating, which makes the manufacturing of the retaining clip expensive, or additional elements are employed for insulation. For assembly, the retaining clip is connected to an insulating base, whereby manufacturing and assembly is likewise associated with greater expense.

U.S. Publication No. 2012/218712 A1 discloses a spring element for pressing-on electronic components, which has a base part with a drilled hole for fastening, for example, to a heat sink, and height adaptation parts directed downwards as well as two spring arms projecting laterally from the base part. The spring arms each consist of a retaining part, which for pressing-on of electronic components via a fastening part, extends obliquely downwards, where the fastening part is provided in each case at the free end of the spring arm. In order to use the spring element for components of different sizes, the height adaptation parts can be inserted into height adaptation holes on the heat sink. This makes assembly relatively time consuming and it may, if necessary, have to be performed manually.

U.S. Publication No. 2009/0168360 A1 discloses an arrangement for pressing electrical components against a heat sink. This arrangement comprises at least one spring element made of sprung material (e.g., steel) spring arms for pressing-on the components, where the spring arms can be slightly curved, a fastener and a spacing element, which is introduced into a hole in the least one spring element and into which the fastener can be introduced. With this arrangement, the assembly is also time-consuming, complex and may if necessary have to be performed manually.

SUMMARY OF THE INVENTION

In view of the foregoing, it is therefore an object of the invention to provide a device for pressing components onto a heat sink, which can be assembled easily and at low cost with little time expenditure and which makes possible a space-saving arrangement of the components while maintaining predefined electrical clearances.

This and other objects and advantages are achieved in accordance with the invention by a device by which components, which are arranged on and mounted on a carrier plate, can be pressed onto a heat sink. When this is done, the components are cooled via the carrier plate and/or via a contacting of the components. To this end, the heat sink is arranged on a side or underside of the carrier plate in a region of the components to be cooled not equipped with components. To this end, the inventive device comprises at least one hollow body and at least one spring arm. The hollow body is configured to at least accept a fastening body, which can be mounted directly on the heat sink, for example, and with which the device can be mounted. Furthermore, the device has at least one spring arm, which is formed at least in a quarter-circle-shaped or ideally Omega-shaped manner. The end of the at least one spring arm has a bearing face for transmitting a pressing force to a component to be cooled, where this bearing face is designed as a polygonal flattening. The inventive device is furthermore formed in one piece as a plastic injection-molded part.

The main aspect of the disclosed inventive solution lies in the fact that the device can be mounted easily and in a time-saving manner (in a relatively short assembly time) on the carrier plate or during the production or assembly of the circuit or the electrical device. The device is particularly suitable for automated assembly. Furthermore, the device makes possible (above all through the embodiment of the at least one spring arm) a space-saving arrangement of the components on the carrier plate and thus a space-saving embodiment of the circuit. With electrical devices, such as switched-mode power supplies, and power-electronic circuits in particular, the device makes it possible (particularly through its hollow body) despite a space-saving arrangement of the component to be cooled, to maintain the predefined electrical clearances or the predefined minimum distances for air and creepage distances between the contacting of a component and the heat sink.

The at least quarter-circle-shaped curved embodiment of the at least one spring arm enables the pressing force over the bearing face to be provided very simply to the component. The curvature of the spring arm in this case has the task of providing a sufficient spring distance and in doing so, to make it possible for components to be cooled to be arranged close enough to one another or to parts conducting electricity (e.g., conductor tracks) while maintaining predefined electrical or safety clearances. The at least one spring arm moreover has a relatively high mechanical load-bearing ability and is space-saving.

A curved Omega-shaped embodiment of the spring arm has proven especially favorable, through which very small distances of components to be cooled from one another and/or from electrically-conducting parts while simultaneously maintaining the predefined electrical clearances and also a good pressing-on of components to be cooled is made possible. Because of an Omega-shaped spring arm, but above all with two or more Omega-shaped spring arms, the device is can furthermore be easily gripped and placed during automated assembly, such as via a robot arm.

Furthermore, there is provision for the bearing face at the end of the at least one spring arm to be formed as a polygonal flattening. The pressing force is thereby evenly transmitted to the component to be cooled or to be pressed on. Through this, the surface of the component is pressed in a simple manner against the heat sink and can be cooled over its entire surface, for example.

In an expedient embodiment, the device is formed in one piece, ideally as a plastic injection-molded part. Through this, the assembly is additionally shortened and simplified because only one part must be attached for pressing on at least one component. Through this, the assembly costs are reduced and the devices or circuits can be produced to allow more space to be saved, more quickly and at lower cost.

To maintain minimum clearances for air and creepage distances in particular, as well as for operational safety reasons, it is of advantage for the device to be formed such that, in an assembled state, a predefined minimum electrical clearance or a predefined minimum distance for the creepage distance between contacts of the component to be cooled and the fastening body and/or a fastener for fixing the device to the carrier plate is maintained. A creepage distance in this case is a shortest distance along a surface of a fixed insulation material between two conductive parts, such as conductor tracks on the carrier plate or a contacting or through-contacting of a component and, e.g., a fastening body or a fastener made of metal.

The spring arm can ideally have a circular or square or rectangular cross section. This enables the pressing force, for example, to be transmitted distributed over a circular or square surface (rather concentrated) or over a rectangular surface to the component to be cooled or the bearing face to be adapted to a component size, for example.

It is furthermore useful for the hollow body of the inventive device to be formed such that a fastener can be introduced, which for an assembly can be connected detachably or non-detachably to the fastening body. To this end, the hollow body can have a hole into which the fastener (e.g., screw, rivet) can be introduced. For the assembly of the inventive device, the fastener can then be connected to the fastening body located in the inside of the hollow body, which is attached to the heat sink for example.

In an expedient embodiment of the inventive device, an inner diameter of the hollow body is formed such that insulation can be introduced between an inner wall of the hollow body and the fastening body.

The hollow body of the inventive device furthermore has torsion proofing, through which in a simple way twisting of the device during placement and fastening is prevented. Through this, an automated assembly is above all facilitated and simplified.

It is expedient for the device made in one piece and ideally as an injection-molded part to be made of an elastic material. The use of an elastic material (above all plastic) for the device does not lead when used in electrical devices to any direct EMC effects, i.e., the device does not cause any undesired electrical and/or electromagnetic effects to occur, which could disrupt the functioning of the electrical device. Furthermore, particularly when high-performance plastics are used (e.g., polyetherimide or PEI, polyamide-imide or PAI), which are resistant to high temperatures, a spring effect of the device is insured over a wide range of temperatures, i.e., through the device the respective component to be cooled is pressed with the corresponding pressure over a wide range of temperatures against the heat sink.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention will be explained below by way of examples with reference to the enclosed figures, in which:

FIG. 1 shows a schematic of an exemplary embodiment of the device for pressing components onto a heat sink in accordance with the invention;

FIG. 2 shows a schematic of a further exemplary embodiment of the inventive device for pressing components onto a heat sink with two spring arms.

DETAILED DESCRIPTION OF THE EXEMPLARY EMBODIMENTS

Figure 3:
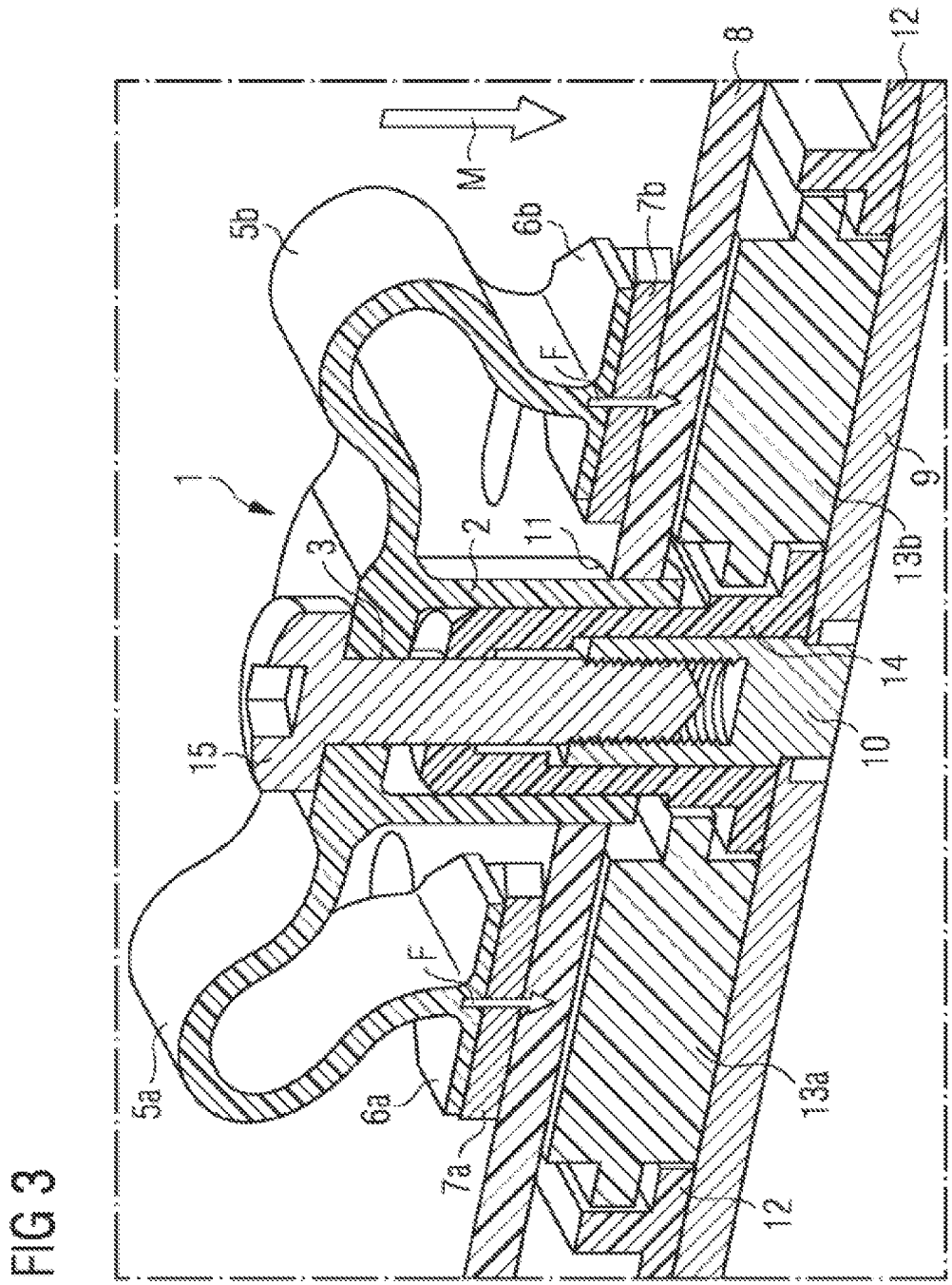
FIG. 3 shows a schematic form of an exemplary embodiment of the inventive device for pressing on components in an assembled state.

FIG. 1 shows in a schematic way an exemplary embodiment of the inventive device 1 for pressing a component 7a, 7b mounted on a carrier plate or printed circuit board 8 onto a heat sink 9 in an oblique view. The device 1 is formed in one piece from an elastic and possibly insulating material and can be produced, for example, via an injection-molding method as an injection-molded plastic part.

The device 1 comprises a hollow body 2, which can be implemented as a hollow cylinder, for example. As an alternative, the hollow body 2 can also have a square or rectangular cross section. The hollow body is configured to accommodate at least one fastening body 10, as will be explained in greater detail with reference to FIG. 3. Here, the inner diameter of the hollow body 2 is formed so that at least the fastening body 10 can be inserted in the hollow body 2. Where necessary, the internal diameter of the hollow body 2 is formed such that, for a greater dielectric strength or to increase an electrical clearance between a contacting of the component 7a, 7b and the fastening body 10, insulation 14 can also be introduced.

Furthermore, the hollow body 2, on an upper side in assembly direction M, has an outlet 3. A fastening means 15 (e.g., a screw or a rivet) can be introduced into this outlet 3 during installation, which can be connected detachably or non-detachably to the fastening body 10. Through the introduction of the fastener 15 or through the connection between fastener 15 and fastening body 10, the device 1 is fastened and the component 7a, 7b is pressed by the pressing force F against the carrier plate 8 or the heat sink 9. For simple placement and assembly of the device 1, the hollow body 2 has torsion proofing 4, which projects beyond a lower end of the hollow body in the assembly direction M and can engage in corresponding outlets of the carrier plate 8.

The device 1 furthermore has a spring arm 5, which has a curved shape. The spring arm 5 shown in FIG. 1 is Omega-shaped, for example, or shaped similarly to the Greek upper case letter Omega Ω. In the simplest case, the spring arm 5 can at least be curved in a quarter circle shape. The spring arm 5 changes into the upper surface of the hollow body 2 in assembly direction M. At one end, the spring arm 5 has a bearing face 6, via which, in the assembled state the pressing force F is transmitted to the component 7a, 7b to be cooled. The bearing face 6 can, for example, depending on the embodiment of the spring arm 5, be circular, square or as shown in FIG. 1, by way of example, rectangular. As an alternative the end of the spring arm 5 can also be formed as a polygonal flattening.

Shown by way of example and schematically in an oblique view in FIG. 2 is a further advantageous embodiment of the inventive device 1 for pressing components 7a, 7b onto a heat sink 9. The embodiment of the device 1 shown in FIG. 2 likewise comprises a hollow body 2 for accommodating the fastening body 10. The hollow body is again implemented as a hollow cylinder, for example, and has an outlet 3, into which a fastener 15 can be introduced. Torsion proofing 4 is again provided on the hollow body 2 for simple placement and assembly.

The embodiment of the device 1 shown in FIG. 2 has two spring arms 5a, 5b, however, via which two components 7a, 7b can be pressed onto a heat sink 8. The spring arms 5a, 5b turn into the upper surface of the hollow body 2 in the assembly direction M and each have an Omega-shaped curved embodiment, for example. The Omega-like shaping of the spring arms 5a, 5b, for example, enables the components to be cooled 7a, 7b to be arranged at relatively small distances from one another on the carrier plate or printed circuit board 8. Each of the spring arms 5a, 5b has at its end a bearing face 6a, 6b, via which the pressing force F is transmitted to the respective component 7a, 7b to be cooled. In this case, for example, for a better transmission of the pressing force F to the respective component 7a, 7b, the bearing faces 6a, 6b are formed as polygonal flattenings.

The device 1 shown in FIG. 2 can, for example, again be formed as a one-piece injection-molded plastic part from an elastic and possibly insulating material. Furthermore, it is conceivable for the device 1, depending and the requirement and/or arrangement of the component, to be cooled 7a, 7b, also to have three, four or more spring arms 5a, 5b.

FIG. 3 shows an embodiment of the device 1 shown by way of example in FIG. 2 with two spring arms 5a, 5b in an assembled state in a longitudinal section through the hollow body 2.

The components to be cooled 7a, 7b are mounted on the carrier plate or printed circuit board 8. The heat sink 9 is arranged on a non-equipped side of the carrier plate 8 at least in the region of the components to be cooled 7a, 7b or in a cooling region, where the heat sink 9 has the fastening body 10 for accommodating the device 1 for pressing on the components 7a, 7b. The carrier plate 8 has an outlet 11, e.g., between the components 7a, 7b, into which the fastening body 10 for the inventive device 1 can be introduced against the assembly direction M of the device. For a galvanic separation of the carrier plate 8 or of the contacting, in particular a through-contacting, of the components 7a, 7b from the heat sink 9, which can be made of metal, in particular aluminum, an insulation layer 12 can be arranged between the side or underside of the carrier plate 8 not equipped in the cooling region and the heat sink 9 or insulating elements 13a, 13b below the components 7a, 7b.

During assembly, the device 1 is introduced in the assembly direction M with the hollow body 2 into the outlet 11 in the carrier plate 8. In this process, the ends of the spring arms 5a, 5b come to rest with the bearing faces 6a, 6b on the components to be cooled 7a, 7b and the hollow body 2 accepts at least the fastening body 10. Furthermore, insulation 14 can also be inserted between an inner wall of the hollow body 2 and the fastening body 10. The inner diameter of the hollow body 2 is then structured such that both the fastening body 10 and also the insulation 14 can be accommodated.

In assembly direction M, a fastener 15 (e.g., screw, rivet) is then introduced through the outlet 3 on the upper side of the hollow body 2 and connected to the fastening body 10. With this connection, the pressing force F is transmitted to the components 7a, 7b via the bearing faces 6a, 6b at the ends of the spring arm 5a, 5b. That is, after fixing of the device 1, the components 7a, 7b are pressed with the pressing force F, which is exerted by the spring arms 5a, 5b against the carrier plate 8 and thus against the heat sink 9.

The device 1, in particular the hollow body 2 is furthermore structure such that a predefined minimum electrical clearance or a predefined minimum distance for a creepage distance between the contacting or through-contacting of the components 7a, 7b and the metallic fastening body 10 and/or the fastener 15 is maintained.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A device via which components are pressable onto a heat sink, the components being mounted on a carrier plate, the heat sink being arranged on a side of the carrier plate which, at least in a cooling region, has no components, and heat being dissipatable from the components at least through the carrier plate, the device comprising:
at least one hollow body for accommodating at least one fastening body; and
at least one spring arm shaped as a Greek upper case letter-shaped Omega, an end of the at least one spring arm having a bearing face for transmitting a pressing force (F) to a component to be cooled;
wherein the bearing face at the end of the at least one spring arm is formed as a polygonal flattening; and
wherein the device is formed in one piece as an injection-molded plastic part,
wherein an internal diameter of the hollow body is set such that both the fastening body, and insulation which is attachable to an inner wall of the hollow body and outer wall of the fastening body is accommodated.

2. The device as claimed in claim 1, wherein the device is configured such that, in an assembled state, a predefined minimum electrical clearance between a contacting of the component to be cooled and at least one of (i) the fastening body and (ii) a fastener is maintained.

3. The device as claimed in claim 2, wherein the hollow body is configured such that the fastener, which is connectable detachably or non-detachably to the fastening body, is introducible.

4. The device as claimed in claim 1, wherein the at least one spring arm has one of (i) a circular, (ii) square and (iii) rectangular cross-section.

5. The device as claimed in claim 2, wherein the at least one spring arm has one of (i) a circular, (ii) square and (iii) rectangular cross-section.

6. The device as claimed in claim 4, wherein the hollow body is configured such that the fastener, which is connectable detachably or non-detachably to the fastening body, is introducible.

7. The device as claimed in claim 1, wherein the hollow body is configured such that the fastener, which is connectable detachably or non-detachably to the fastening body, is introducible.

8. The device as claimed in claim 1, wherein the hollow body additionally includes torsion proofing, via which twisting of the device during placement and fastening is prevented.

9. The device as claimed in claim 1, wherein the device is formed from elastic material.

* * * * *